US005751327A

United States Patent [19]

De Cock et al.

[11] Patent Number: 5,751,327

[45] Date of Patent: May 12, 1998

[54] PRINTER INCLUDING TEMPERATURE CONTROLLED LED RECORDING HEADS

[75] Inventors: Etienne Marie De Cock; Lucien Amede De Schamphelaere, both of Edegem; Alfons Jakob Grobben, Heverlee, all of Belgium

[73] Assignee: Xeikon N.V., Mortsel, Belgium

[21] Appl. No.: 255,609

[22] Filed: Jun. 8, 1994

[30] Foreign Application Priority Data

Jun. 18, 1993 [EP] European Pat. Off. .............. 93304770

[51] Int. Cl.$^6$ ............................ B41J 2/385; B41J 2/435; B41J 2/45; H05K 7/20

[52] U.S. Cl. .......................... 347/130; 347/118; 347/232; 347/238; 361/699; 165/80.4

[58] Field of Search .................................... 347/238, 224, 347/233, 118, 232, 130; 361/699; 372/34, 35, 36; 257/706, 88; 165/80.4, 168

[56] References Cited

U.S. PATENT DOCUMENTS

| | | | |
|---|---|---|---|
| 3,141,998 | 7/1964 | Silkman | 165/80.4 X |
| 4,721,996 | 1/1988 | Tustaniwskyj et al. | 257/713 |
| 4,821,051 | 4/1989 | Hediger | 347/130 |
| 5,192,958 | 3/1993 | Charnitski | 347/242 |
| 5,211,493 | 5/1993 | Stephenson et al. | 400/719 |
| 5,285,347 | 2/1994 | Fox et al. | 361/699 |

FOREIGN PATENT DOCUMENTS

| | | |
|---|---|---|
| 0464948 | 1/1992 | European Pat. Off. . |
| 3822890 | 9/1989 | Germany . |
| 5722070 | 6/1982 | Japan . |
| 61-205154 | 11/1986 | Japan . |
| 63-302076 | 8/1988 | Japan . |
| 63168372 | 12/1988 | Japan . |
| 9217745 | 10/1992 | WIPO . |

*Primary Examiner*—David F. Yockey

*Attorney, Agent, or Firm*—Brumbaugh, Graves, Donohue & Raymond

[57] ABSTRACT

An electrophotographic printer includes a plurality of recording heads connected in series in a closed cooling circuit. Each of the recording heads includes a linear array of light-emitting diodes (LEDs) on a common thermally conductive LED carrier bar. The carrier bar carries a series of modules, each module containing N LEDs with their associated drivers. The carrier bar is provided with a U-shaped duct inside a thermally conductive body which is in thermally conductive contact with the carrier bar. The duct extends between a fluid inlet and a fluid outlet and has a cooling fluid such as water flowing therethrough.

8 Claims, 5 Drawing Sheets

PRINTER INCLUDING TEMPERATURE CONTROLLED LED RECORDING HEADS

FIELD OF THE INVENTION

The present invention is concerned with a temperature-conditioned LED recording head comprising light emitting diodes (LEDs) and an electrophotographic printer containing one or more of such recording heads for image-wise exposure of photoconductive member(s) of the printer.

BACKGROUND OF THE INVENTION

In electrophotographic printing an overall electrostatically charged photoconductive dielectric recording member is image-wise exposed to conductivity increasing radiation producing thereby a "direct" or "reversal" toner-developable charge pattern on the recording member. "Direct" development is a positive-positive development, and is suited for producing pictures and text.

"Reversal" development is a "positive-negative" or vice versa development process and is of particular interest when the exposure derives from an image in digital electrical form, wherein the electrical signals modulate a laser beam or the light output of light-emitting diodes (LEDs). It is advantageous with respect to a reduced load of the electrical signal modulated light source (laser or LEDs) to record graphic information (e.g. printed text) in such a way that the light information corresponds with the graphic characters so that by "reversal" development in the exposed area of a photoconductive recording layer, toner can be deposited to produce a positive reproduction of the electronically stored original. In high speed electrophotographic printing the exposure derives practically always from electronically stored, e.g. computer stored, information.

In the electrophotographic art multi-colour printers are known that produce a plurality of colour toner images on a photoconductive drum or endless belt wherefrom the toner images are transferred directly onto printing stock material such as a paper sheet or paper web material. In an alternative embodiment the toner images formed on a photoconductive recording member are transferred subsequently to an intermediate insulating belt from distinct image forming stations and are then transferred simultaneously to a receiving sheet or web that eventually is cut into sheets containing a desired printing frame dimension.

At present, more and more use is made of LED arrays at the exposure station of electrophotographic printers, the light from the LEDs being focused by an optical system, e.g. by a rod-like lens array, onto the photoconductive drum or belt, taking advantage of the fact that LED exposure stations have no moving parts and that no complicated optics are required, such as is the case in laser printers. One has to take care that the LEDs remain in a constant position with respect to the optical system.

The use of LED arrays has a particular advantage over the application of image-wise modulated scanning laser beams in that positional accuracy, especially important in multi-station printers where two or more images have to be imposed in exact registration, is easier to achieve. Moreover, LED arrays are available at a sufficiently high packing density, say 600 and even more LEDs per inch, so that the necessary conditions for high resolution printing are fulfilled.

Details about the construction of LED image bars are given in the book "Imaging Processes and Materials" Neblette's Eight Edition—Edited by John Sturge et al., Van Nostrand Reinhold—New York (1989), 388–390 and in U.S. Pat. No. 5,177,500 (Eastman Kodak Company). Light emitting diodes emit electromagnetic radiation at particular wavelengths as a direct conversion of electrical energy. This radiation depends on the chemical composition of the host crystal and the dopant(s).

Commonly used light emitting diodes are made of $GaAs_{1-x}P_x$ crystals in which phosphorus is the dopant and its concentration (x) largely defines the wavelength of light emission which for x=0.4 is 660 nm. High light outputs are possible with an efficiency approaching 50%, the rest being heat that has to be dissipated.

It is known that the efficiency, i.e. the brightness of the light emission decreases as the temperature of the LEDs increases and that also their life time drops with raising temperature. The decrease in brightness affects the imaging quality of an LED array exposure device. It is desirable to operate LED exposure devices at a temperature not surpassing 40° C., and more preferably at a temperature in the range of 25° to 35° C. For reliable pixel-wise imaging it is necessary that there is no substantial temperature difference (gradient) between the individual LEDs as explained e.g. in U.S. Pat. No. 5,177,500, referred to above.

Therefore, it is usual to mount the LED array(s) on a carrier bar connected to a heat sink being usually a metal panel provided with metal fins and for extensive cooling to resort to a blower. In electrophotographic printers operating with fine toner particles turbulent air cooling may cause dust-circulation and dust deposition e.g. on the corona wires and the light-emitting side of the LEDs, which has to be avoided.

The use of LED image bars containing linear arrays of light emitting diodes arranged in single or staggered rows in multi-colour high speed multiple-station electrophotographic printers incorporating yellow, magenta, cyan and black printing stations require very accurate registration of the monochrome images in order to form according to the principles of subtractive colour mixing a high quality full colour image. This high accuracy depends largely on a correct positioning of the individual LEDs in each imaging bar but also on the positioning of the image bars with respect to each other and with respect to their optical system. Since the LEDs of an individual imaging bar are mounted on a common carrier bar made of metal any varying thermal deformation, e.g. linear expansion or contraction, of the spatially adjusted LED image bars has to be avoided since otherwise mis-registration of the different monochrome images will take place.

In U.S. Pat. No. 5,192,958 (Charnitski/Xerox Corporation) there is described an arrangement of a plurality of LED print bars on a common sub-frame, a cooling medium being passed through the subframe and in parallel through each of the LED print bars from one end thereof to the other, the purpose being to maintain the arrays at a predetermined temperature, in order to control registration.

By passing the cooling medium through each LED print bar from one end thereof to the other, the temperature difference between a given LED and the adjacent cooling medium will depend upon the position of the LED along the print bar. Therefore a variable cooling effect is achieved with the result that the temperature may not be the same along the print bar. A variable temperature may result in a variation in LED light output, and consequently a lack of uniformity of image density.

It is an object of the present invention to provide an improved effective and accurate temperature-controlled LED image bar for use in an electrophotographic printer which LED image bar is operated in contact with a cooling medium kept separate from the surroundings of the interior parts, e.g. development station, of the printer.

It is a particular object of the present invention to provide a recording head comprising an array of LEDs on a common LED carrier bar particularly suitable for use in an electrophotographic printer in which the cooling of said carrier bar and of the individual LEDs proceeds very effectively and accurately avoiding thereby image quality reduction arising from fluctuations in light output and spatial displacement of the LEDs.

It is another object of the present invention to provide an electrophotographic printer, more particularly a multiple-station electrophotographic printer comprising a plurality of said recording heads having high dimensional stability by their accurate temperature control, thereby avoiding mis-registration of individual monochrome images.

SUMMARY OF THE INVENTION

According to a first aspect of the present invention there is provided a recording head comprising a linear array of light-emitting diodes (LEDs) on a common thermally conductive LED carrier bar which carries a series of modules, each module containing N LEDs with their associated drivers, said carrier bar being associated with cooling means in thermally conductive contact therewith, said cooling means comprising a U-shaped duct inside a thermally conductive body in thermally conductive contact with said carrier bar, said duct extending between a fluid inlet and a fluid outlet for allowing the flow of a cooling fluid therethrough.

According to a further aspect of the present invention there is provided an electrophotographic printer comprising in an image-producing station a recording head comprising a linear array of light-emitting diodes (LEDs) on a common thermally conductive LED carrier bar which carries a series of modules, each module containing N LEDs with their associated drivers, said carrier bar being associated with cooling means in thermally conductive contact therewith, said cooling means comprising a U-shaped duct inside a thermally conductive body in thermally conductive contact with said carrier bar, said duct extending between a fluid inlet and a fluid outlet for allowing the flow of a cooling fluid therethrough.

Preferably, the material of which said carrier bar and/or the cooling body is comprised is a metal, most preferably selected from copper, brass, aluminium and mixtures thereof.

In a preferred embodiment, the light emitting faces of the LEDs are in light-focusing association with a rod lens array.

Either said LED carrier bar and said cooling body are separate parts which can be secured together in such a manner as to be capable of being dismounted from each other, or the cooling body and the carrier bar are formed in one piece.

The cooling fluid will generally be a liquid such as water for reasons of cost and convenience, but other cooling liquids may be used if desired.

The recording head according to the invention is of particularly advantageous use in a multiple-station electrophotographic printer comprising a plurality of image-producing stations, each including a recording head. In such a printer, there may be provided a closed cooling circuit for the temperature control of the recording heads, the circuit comprising a cooling fluid reservoir, a heat exchanger for removing excess heat from the cooling fluid, a pump and associated pipe-work to feed the cooling fluid to the ducts of the recording heads, either in series or in parallel.

BRIEF DESCRIPTION OF THE DRAWINGS

The invention will now be further described, purely by way of example, by reference to the accompanying drawings in which.

Throughout the drawings and related description similar reference numbers refer to similar elements or members.

PREFERRED EMBODIMENTS OF THE INVENTION

Figure 1:
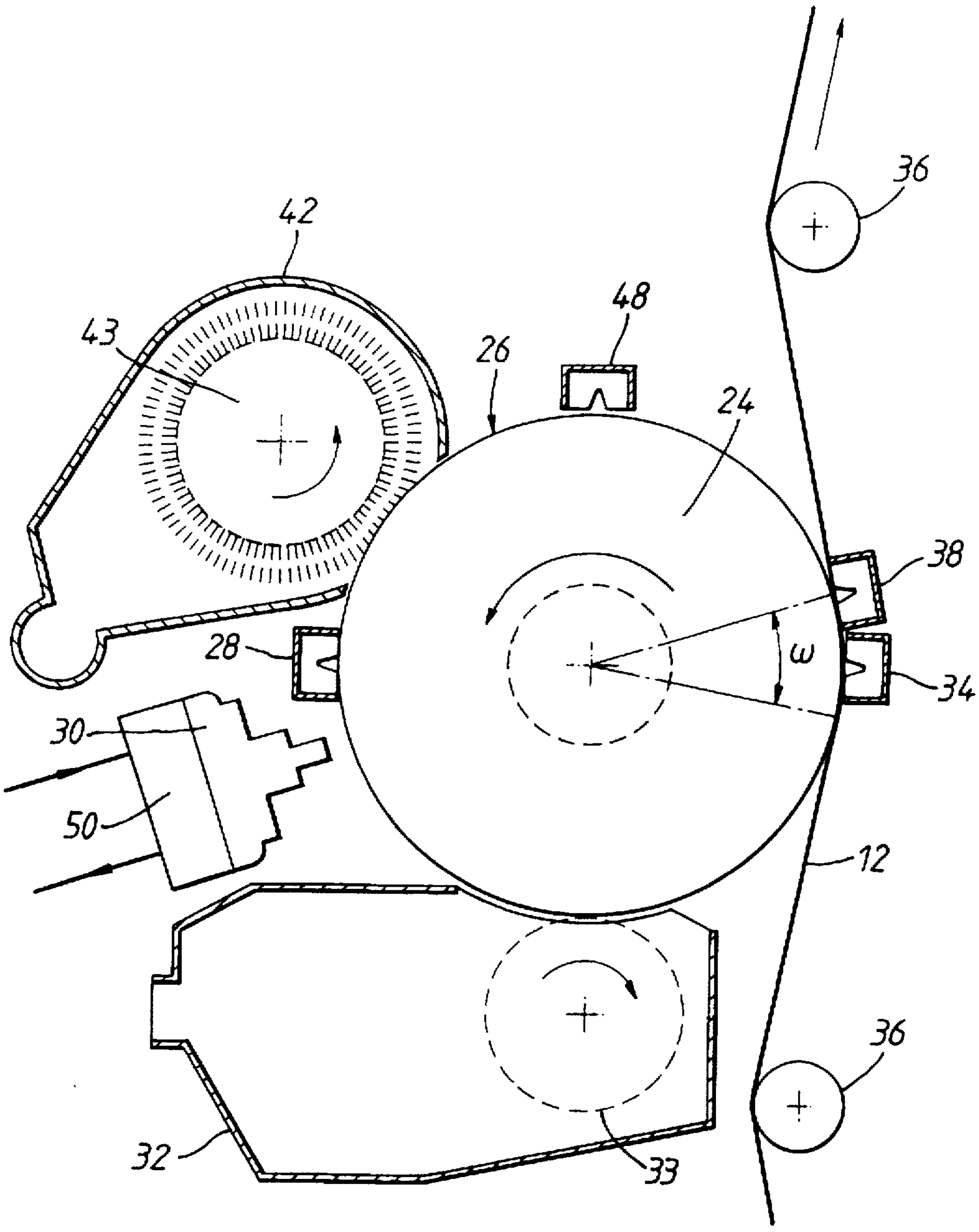
FIG. 1 is a schematic cross-sectional view of an image-producing station, also called printing station, comprising an LED image bar (recording head) according to the present invention and its relationship to a photoconductive surface of an electrostatically charged photoconductive recording member.

As shown in FIG. 1, each printing station comprises a cylindrical drum 24 having a photoconductive outer surface 26. Circumferentially arranged around the drum 24 there is a main corotron or scorotron charging device 28 capable of uniformly charging the drum surface 26, for example to a potential of −600 V, an LED image bar 30 provided with a cooling block 50 having an inlet and outlet (shown by arrows) for a cooling liquid. The LEDs being arranged in a linear array are electrically energized to image-wise line-after-line expose the photoconductive drum surface 26 causing the charge thereon to be selectively reduced. For example, in order to carry out reversal development, the potential in the exposed areas is reduced to about −250 V, leaving an image-wise distribution of electric charge to remain on the drum surface 26. This so-called "latent image" is rendered visible on passing a development station 32 which by means known in the art brings an electrostatographic developer in contact with the drum surface 26. The development station 32 includes a developer drum 33 forming a so-called magnetic brush. In magnetic brush development the developer contains (i) toner particles containing a mixture of resin, a dye or pigment of the appropriate colour and normally also a charge-controlling agent defining the triboelectric charge polarity, and (ii) carrier particles charging the toner particles by frictional contact therewith. The carrier particles may be made of magnetizable material, such as iron or iron oxide. In a typical construction of the development station, the developer drum 33 contains magnets carried within a rotating sleeve causing the mixture of toner and magnetizable material to rotate therewith, to contact the surface 26 of the drum 24 in a brush-like manner.

After development, the toner image adhering to the drum surface 26 is transferred to the moving web 12 by a transfer corona device 34. The moving web is in face-to-face contact with the drum surface 26 over a wrapping angle ω of about 15° determined by the position of the guiding rollers 36. The charge sprayed by the transfer corona device, being opposite of the side of the web to the drum, and having a polarity opposite in sign to that of the charge of the toner particles, attracts the toner particles away from the drum surface 26 and onto the surface of the web 12. The adherent force created by the charge sprayed by the transfer corona device and the tensioning of the web 12 in contact with the drum surface 26 using a drive roller and brake (shown in FIG. 4) and the guiding rollers 36 defining the wrapping angle make that the drum surface moves in synchronism with the movement of the web and is actually driven thereby. The web, however, should not tend to wrap around the drum beyond the point dictated by the positioning of a guide roller 36 and there is provided circumferentially beyond the transfer corona device 34 a web discharge corona device 38 driven by alternating current and serving to discharge the web 12 and thereby allow the web to become released from the drum surface 26. The web discharge corona device 38 also serves to eliminate sparking as the web leaves the surface 26 of the drum.

Thereafter, the drum surface 26 is pre-charged to a level of, for example −580 V, by a pre-charging corotron or scorotron device 48. The pre-charging makes the final charging by the corona 28 much easier. Thereby any residual toner which might still cling to the drum surface may be more easily removed by a cleaning unit 42 known in the art. The cleaning unit 42 includes an adjustably mounted cleaning brush 43, the position of which can be adjusted towards or away from the drum surface 26 to ensure optimum cleaning. The cleaning brush 43 is earthed or subject to such a potential with respect to the drum as to attract the residual toner particles away from the drum surface. After cleaning, the drum surface is ready for another recording cycle.

Figure 2:
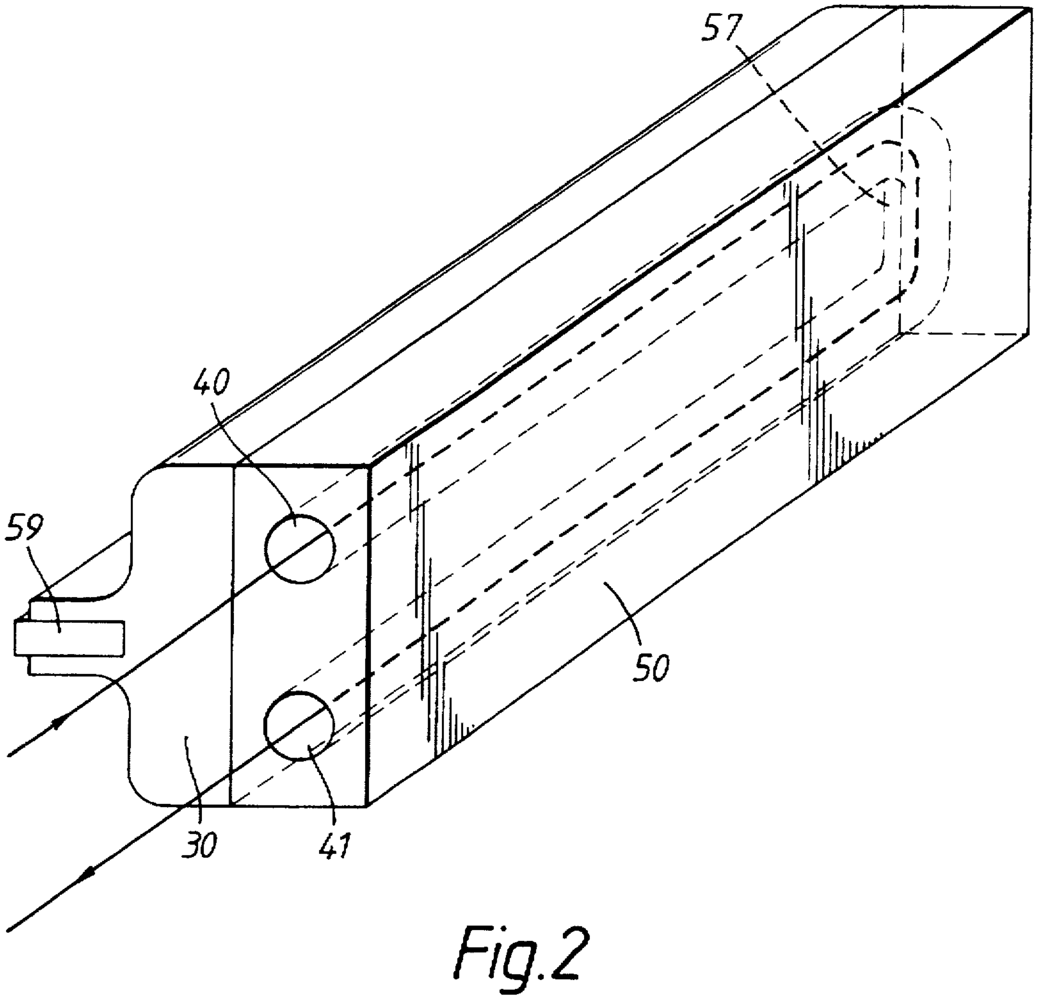
FIG. 2 represents an isometric drawing of an embodiment of an LED image bar according to the present invention.

In FIG. 2, being an isometric drawing of an LED image bar according to the present invention, element 50 is a cooling body (block), preferably made of a thermally conductive metal e.g. copper, brass or aluminium. The cooling block 50 contains an U-shaped duct or channel 57, having an upper arm 40 and a lower arm 41. The channel 57 may be formed by casting the block 50 lengthwise in two parts and joining them with a thermoconductive glue to form the duct 57 having an inlet and outlet to allow the entry and exit of liquid into and from the duct 57. The block 50 is assembled with a common LED carrier bar 30 carrying a linear array of a series of modules (not shown in the drawing) each module containing N LEDs, where N is a whole number, with their associated drivers carried by a module carrier. Typical modules contain 64, 128 or 256 LEDs. The LED carrier bar is preferably also made of a thermally conductive metal e.g. copper, brass or aluminium.

The light emitting faces of the LEDs are in light-focusing relationship associated with a rod lens array 59 (see. e.g. U.S. Pat. No. 4,905,021) which rod lenses are sold under the tradename "SELFOC" of the Nippon Sheet Glass Co. The rod lenses have a graded refractive index profile, (see "Fibre Optics Handbook" by Christian Hentschel, Hewlett-Packard GmbH, Boeblingen Instruments Division, Germany March 1989, p. 197–198).

Figure 3:
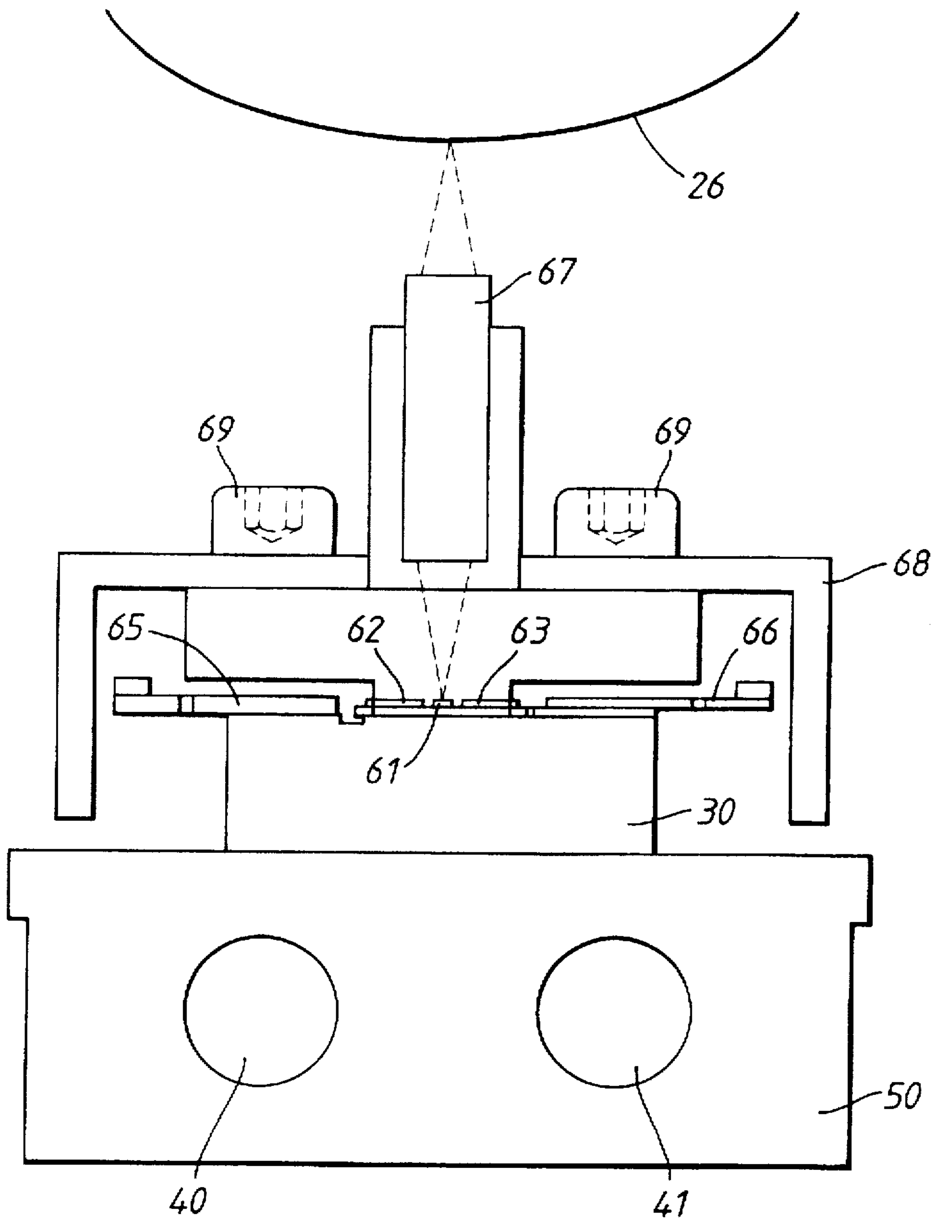
FIG. 3 represents a schematic cross-sectional view of an LED recording head showing the position of the LEDs with respect to the drivers and printed circuit boards (PCBs) on a common LED carrier bar.

FIG. 3 shows a cross-sectional view of an LED print head containing a cooling block 50. In FIG. 3, element 61 represents one of the LEDs of the array. Elements 62 and 63 are drivers associated with the LEDs and symmetrically mounted on module carriers as defined above carried by the common carrier bar 30. Interconnection Printed Circuit Boards (PCBs) 65 and 66 respectively are mounted on the same carrier bar 30.

Co-extending with the linear LED array formed by a series of LEDs 61 there is provided a "SELFOC" (tradename) array of auto-focusing fibres 67. The focusing of the light emitted by the LEDs 61 onto the photoconductive drum surface 26 is represented by dashed lines in the drawing. A cap 68 for fixedly mounting the array of auto-focusing fibres 67 to the LED carrier bar 30 is provided and the cap 68 is fixed by means of screws 69. The cooling body 50 fixed by screws or thermally conductive glue to the carrier bar 30 has arms 40 and 41 respectively of the U-shaped duct for the passage of a cooling liquid.

It is in favour of rapid repairs e.g. when one or more defective modules in an LED image bar have to be replaced that the cooling body (block) remains fixedly arranged in the printer and serves as a kind of positioning-template for the LED image bar which is mounted thereon in registration position.

According to an alternative embodiment the cooling body 50 and the LED carrier bar 30 may be formed in one piece.

Although a number of cooling liquids may serve the purpose, water is used preferably.

Figure 4:
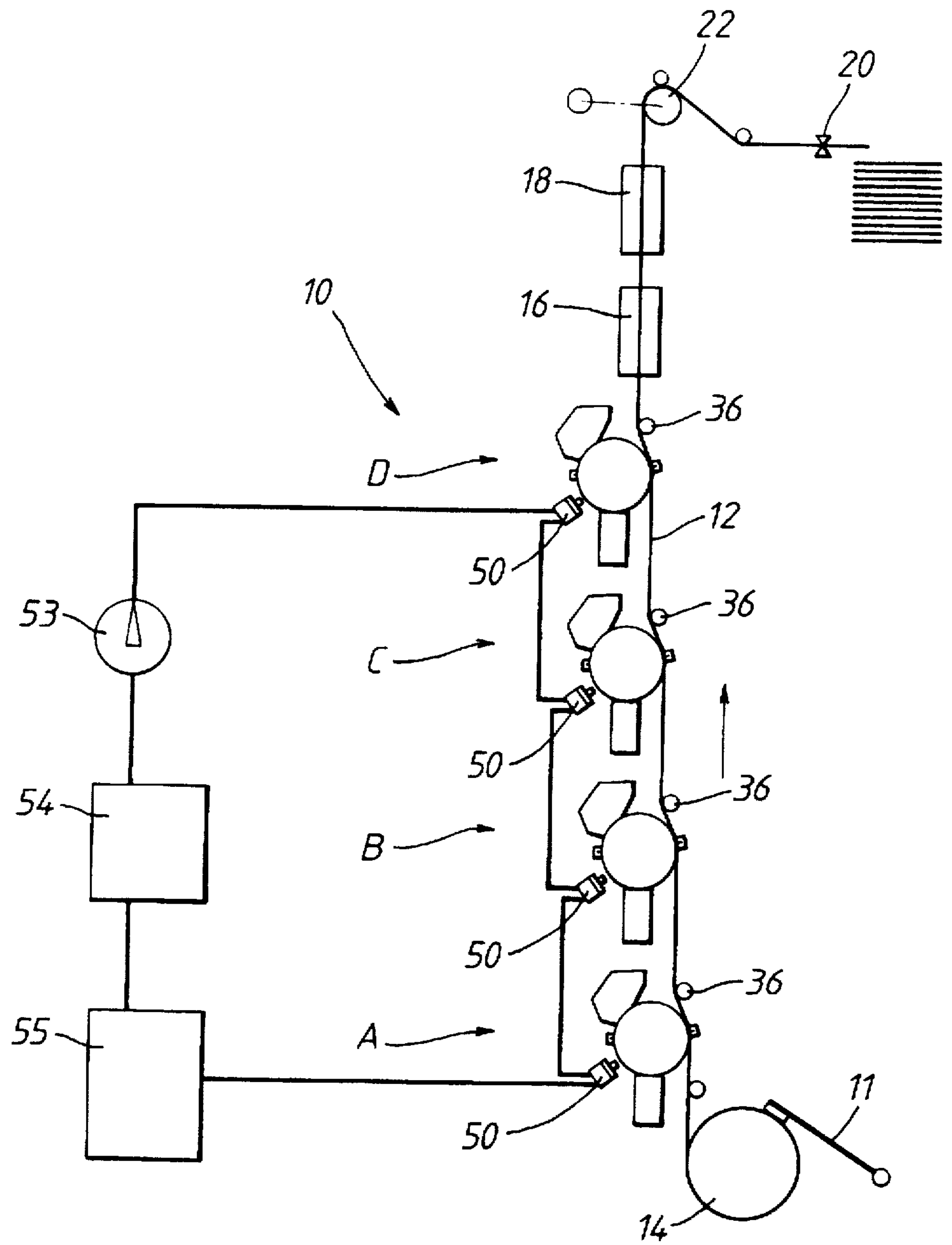
FIG. 4 shows schematically an electrophotographic single pass multiple-station printer according to the present invention comprising in each printing station a liquid-cooled LED image bar, wherein the cooling liquid is flowing in a closed circuit comprising LED image bars of successive printing stations connected in series.

FIG. 4 represents schematically an electrophotographic single pass multiple-station printer 10 according to the present invention comprising in each printing station (A, B, C and D) a liquid-cooled LED image bar. As shown the cooling liquid is flowing in a closed circuit 56 comprising the cooling blocks 50 of successive LED image bars connected in series. In the circuit, element 53 is a pump, element 54 a liquid reservoir and element 55 is a heat-exchanger including a temperature-controllable refrigerator device.

In the printer image-producing stations A, B, C and D (a single station being shown in detail in FIG. 1) are arranged in a substantially vertical configuration, although it is of course possible to arrange the stations in a horizontal or other fashion. A web 12 of paper unwound from a supply roller 14 is conveyed in upwards direction past the printing stations in turn. The moving web 12 is in face-to-face contact with the drum surface 26 over a wrapping angle X of about 15° (see FIG. 1) determined by the position of the guiding rollers 36. After passing the last print station D, the web of paper 12 passes through a toner image-fixing station 16, and an optional cooling zone 18 and thence to a cutting station 20 to cut the web into sheets. The web 12 is conveyed through the printer by a motor-driven roller 22 and tension in the web is generated by the application of a brake 11 acting upon the supply roller 14.

In a practical embodiment operating with an LED image bar having an energy input of 40 W a flow rate of 3 l per minute of water is sufficient. The temperature of the water entering the cooling block(s) is preferably about 30° C. and that temperature is preferably kept constant within a margin not larger than 2 C°. The cooling provided by the cooling liquid within one LED carrier bar is suitably such that the temperature gradient within said bar is preferably at most 1 C°. The difference in temperature of the LEDs of one carrier bar with respect to another LED carrier bar of a multiple-station printer is suitably kept within a temperature range not larger than 2 C°. Where four carrier bars are connected in series, we have found for example that a cooling medium flow rate of 3 litres per minute is sufficient to enable the temperature difference between the bars to be kept within 2 C°.

Figure 5:
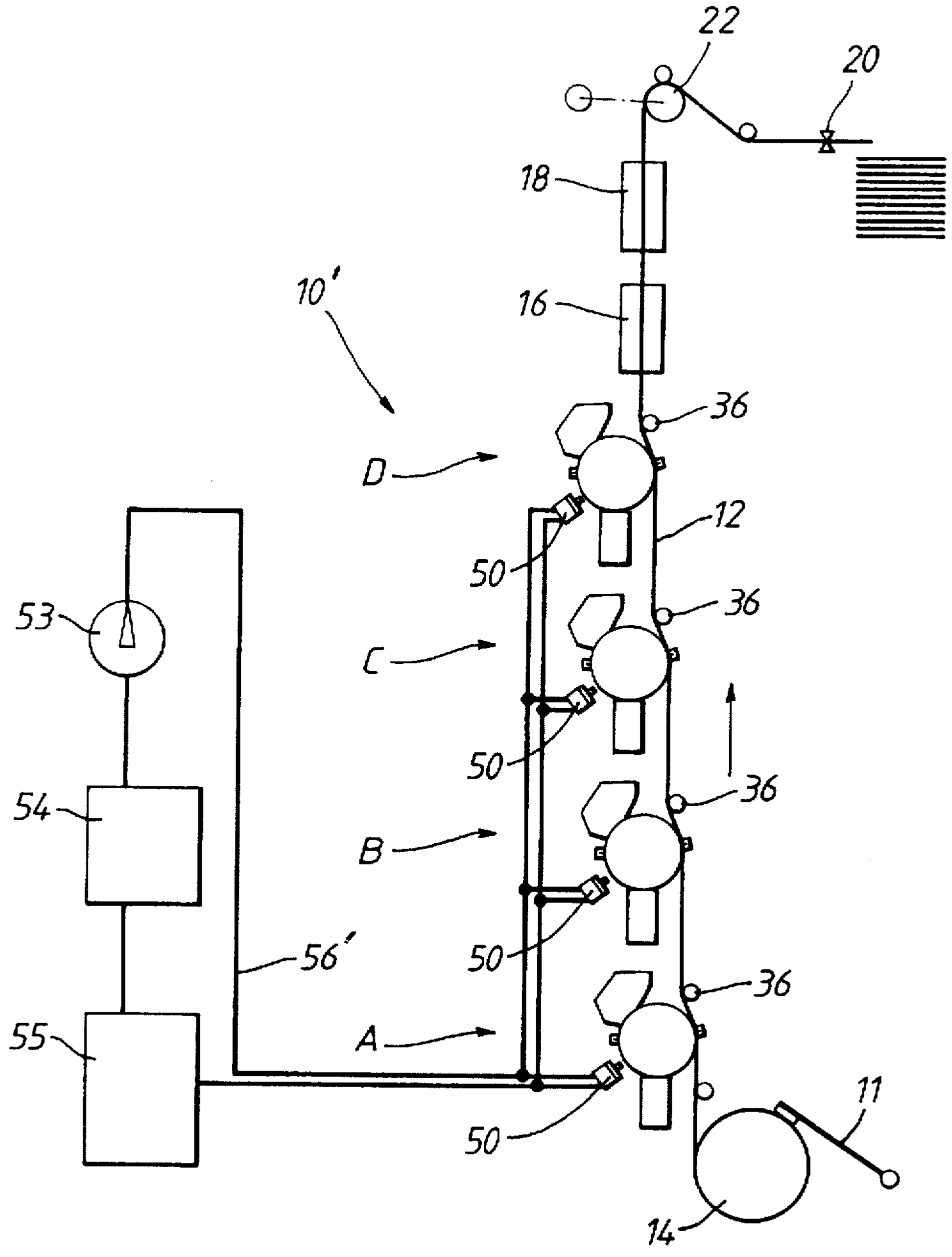
FIG. 5 shows schematically another electrophotographic single pass multiple-station printer according to the present invention comprising in each printing station a liquid-cooled LED image bar, wherein the cooling liquid is flowing in a closed circuit comprising LED image bars of successive printing stations connected in parallel.

FIG. 5 represents schematically an electrophotographic single pass multiple-station printer 10' similar to the printer 10 in FIG. 4. As shown that cooling liquid is flowing in a closed circuit 56' comprising the cooling blocks 50 of successive LED image bars connected in parallel.

What is claimed is:

1. An electrophotographic printer comprising a plurality of image-producing stations, each of said image-producing stations including a recording head comprising a linear array of light-emitting diodes mounted on a common thermally conductive LED carrier bar having a longitudinal axis, wherein each said recording head is connected in series with each other said recording head in a closed cooling circuit; said carrier bar carrying a series of modules arranged along said longitudinal axis of said carrier bar, each of said modules containing N of said light emitting diodes with associated drivers; said carrier bar being in thermally conductive contact with a cooling means for cooling said carrier bar, said cooling means comprising a U-shaped duct inside a thermally conductive body in thermally conductive contact with said carrier bar, said duct extending between a fluid inlet located at one end of said carrier bar along said longitudinal axis and a fluid outlet location at said one end of said carrier bar for allowing flow of a cooling fluid therethrough, said U-shaped duct having an upper arm portion and a lower arm portion, said upper arm portion and said lower arm portion extending along the longitudinal axis of said carrier bar, said cooling fluid in said upper arm portion and said lower arm portion collectively cooling said carrier bar over the length thereof.

2. A printer according to claim 1, wherein said said carrier bar and said cooling body are comprised of a metal.

3. A printer according to claim 2, wherein said metal is selected from copper, brass, aluminium and mixtures thereof.

4. A printer according to claim 1, further comprising a rod lens array, light emitting faces of said light emitting diodes being in light-focusing association therewith.

5. A printer according to claim 1, wherein said carrier bar and said cooling body comprise separate parts detachably connected together.

6. A printer according to claim 1, wherein said cooling body and said carrier bar are formed in one piece.

7. A printer according to claim 1, wherein said cooling fluid is water.

8. A printer according to claim 1, wherein said closed cooling circuit comprises said duct of each said cooling means, a pump, a fluid reservoir, and a heat exchanger.

* * * * *